United States Patent [19]
Jorgensen

[11] Patent Number: 4,706,299
[45] Date of Patent: Nov. 10, 1987

[54] FREQUENCY ENCODED LOGIC DEVICES

[76] Inventor: Peter O. Jorgensen, 12175 Glacier Hwy., #D3, Juneau, Ak. 99801

[21] Appl. No.: 610,592

[22] Filed: May 15, 1984

[51] Int. Cl.$^4$ ............................................. H04B 9/00
[52] U.S. Cl. ...................... 455/608; 307/473
[58] Field of Search .................. 370/2, 3; 455/608; 307/473, 475, 472, 474

[56] References Cited

U.S. PATENT DOCUMENTS

| | | | |
|---|---|---|---|
| 3,090,923 | 5/1963 | Wolff | 307/472 |
| 3,501,640 | 3/1970 | Harris | 370/3 |
| 3,508,033 | 4/1970 | Turecki | 307/473 |
| 3,662,193 | 5/1972 | Braddock | 307/473 |

FOREIGN PATENT DOCUMENTS 57-154954 9/1982 Japan .................................. 455/608

Primary Examiner—Joseph A. Orsino, Jr.
Attorney, Agent, or Firm—Roland H. Shubert

[57] ABSTRACT

Logic devices for frequency encoded trinary logic signals are simulated by standard binary circuits. The binary circuits include frequency sensing and frequency selecting devices at the inputs and outputs thereof for decoding the frequency encoded trinary logic signals to binary level logic signals and for frequency encoding the resulting binary output to trinary logic signals. Optical encoding using the three primary light frequencies provides a convenient trinary signal format for the frequency encoded signals. A latch register, a shift register, a half adder and full series and parallel adder circuits are disclosed.

15 Claims, 8 Drawing Figures

FREQUENCY ENCODED LOGIC DEVICES

TECHNICAL FIELD

This invention relates to logic devices, and more specifically to trinary logic devices using frequency encoding, and particularly optical frequency encoding, for communicating trinary logic levels of signals to and from external devices.

BACKGROUND ART

Logic devices having more than two logic levels are well known in the art. Such devices having three logic levels are known as trinary logic devices.

One such trinary logic device is described in Braddock U.S. Pat. No. 3,662,193. Therein, a clocked trinary flip flop latch is described in terms of a plurality of AND and OR gates. In operation, the latch provides one of three output level signals during a clock pulse, the signal maintains its level thereafter until injection of an input condition change by the next following clock pulse. The device is incapable of communicating with external devices which may generate optical output devices or which may only respond to optical (or other frequency range) signals.

A number of different trinary logic circuits are disclosed in Turecki U.S. Pat. No. 3,508,033, including a trinary counter and a three state latch circuit. These circuits, too, suffer from the disadvantage of being unable to communicate with or perform logic operations on externally generated signals represented by specific frequency components.

Wolff U.S. Pat. No. 3,090,923 teaches logic circuits which incorporate modulators or mixers for performing logic operations on signals of various frequencies. One frequency represents a logic one level, and another frequency represents a logic zero level, for example. Thus, frequencies of a number of signals in the circuit are changed as a result of binary logic operations performed on combinations of the signals.

The circuitry used for performing the logic operations on the frequency signals is complex, however, and, as with the other prior art circuits, requires the provision of substantial wiring to implement and to communicate with input and output devices.

Although the use of optoelectronic circuits in logic devices has been suggested, as provided at Yhap U.S. Pat. No. 2,952,792, for example, such devices fail to utilize optical frequency signals for inputting and outputting logic signals and for communicating with external devices. In the '792 patent, optoelectronic devices are used to form a basic, or universal, logic block using photoconductors as switching elements and electroluminescent lamps facing related photoconductors as switch operators. Thus, although logic operations are performed on optical signals, the circuit is complex and requires an individualized custom design effort to produce.

There is thus a need in the prior art for logic devices utilizing simple, standard circuits capable of performing multi-level logic operations, such as trinary logic operations, and which are capable of communicating with external devices using optically encoded signals. More specifically, there is a need for logic devices capable of performing logic operations on optical (or other frequency range) signals and which do not require specialized optical frequency range operating devices.

DISCLOSURE OF INVENTION

It is accordingly a primary object of the present invention to provide a device capable of performing logic operations on frequency encoded logic level signals without requiring speciallized ciruitry therefor.

It is a more particular object of the invention to provide a device for performing logic operations on optically encoded signals without requiring optical logic circuits.

It is still a more specific object of the invention to provide logic devices for performing trinary logic operations on optically encoded logic signals, the device being free of complex optical logic circuitry.

Yet another object of the invention is the provision of combinations of standard binary logic circuits for performing trinary logic operations on optically encoded trinary logic level signals.

It is an additional object of the invention to provide frequency sensitive means at an input of a trinary logic circuit for decoding frequency encoded signals wherein presence or absence of specific frequencies is used to indicate particular logic levels, to provide combinations of standard binary logic circuits for performing trinary logic operations on the decoded signals, and to provide frequency selecting means at an output of the trinary logic circuit for encoding output signals thereof in terms of presence or absence of said specific frequencies, thereby simulating direct performance of trinary logic operations on said frequency encoded signals.

In accordance with the foregoing and other objects of the invention, there is provided an improvement for a logic apparatus, which includes a means for decoding and encoding input and output signals to and from the apparatus. The decoding and encoding means particularly include frequency sensing and frequency selecting means for respectively converting logic states of the signals, represented by presence and absence of signals at specific frequencies, to and from voltage level representations of said logic states.

Preferably, the voltage level representations are in the form of binary logic levels, and the frequency signals include three frequency components to represent various levels of a trinary signal. Ensembles of three binary signals are provided to represent the trinary level signals.

In accordance with another feature of the invention, there is provided a logic apparatus for performing logic operations on an input optical signal and for producing at least one output signal. A binary logic circuit is provided for performing logic operations on binary signals and for providing an output ensemble of binary signals. Optical frequency sensing and selecting means are provided for decoding and encoding the input optical signal to, and the output optical signal from, the binary logic circuit thereby to permit the circuit to operate on binary signals.

Preferably, the logic apparatus is a trinary logic apparatus formed of binary logic circuits and the optical signals encode trinary signal levels by presence and absence of three frequency components thereof. The three frequency components may include the three light primaries of the visible spectrum.

In accordance with one form of the invention, the binary logic circuits form a logic half adder. Alternatively, the binary logic circuits may form a logic register or a logic shift register.

The foregoing and other features, objects and advantages of the present invention may be more readily perceived and understood with the aid of the present specification when viewed in conjunction with the drawings. It should be understood that the specification and preferred embodiments of the invention disclosed therein are provided by way of illustration and not of limitation of the scope of the invention which is defined by the claims appended hereto when interpreted in accordance with the full breadth to which such claims are legally and equitably entitled.

BEST MODE FOR CARRYING OUT THE INVENTION

The present invention thus provides an apparatus for simulating the performance of logic operations on optically encoded signals. The inventive structure permits the use of standard binary logic circuits to perform the desired operations by converting the optically encoded signals to standard binary signals.

Figure 1:
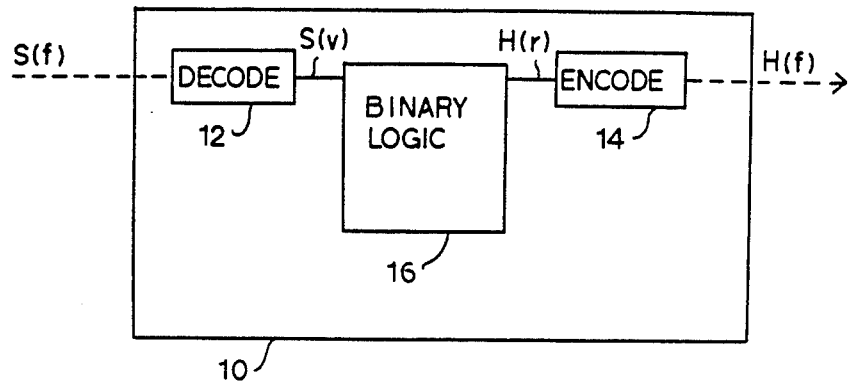
FIG. 1 shows a block diagram illustrating a concept of the invention.

Thus, referring to FIG. 1, there is shown, in its broadest sense, the concept of the present invention. As illustrated in the figure, there is provided a frequency encoded input designated by S(f). While the input may be encoded in any manner with respect to frequency, preferably the input includes a number N of separate frequency encoded signal components.

In the preferred embodiment of the invention, there is thus provided an input signal S(f), formed of a group of input signal components. The input group is comprised of a plurality of input signal components S(f), each of which has as its argument three frequency components. Various values, or levels, of the group of input signals are represented by the presence or absence of the several frequency components in each of the input signal components.

As will be understood, each of the input signal components may be encoded in a number of well known methods with respect to frequency. For example, with three variables, each input signal component may assume any one of $3^2$ values. In order to simplify the following description, however, it is assumed that each one of the input signal components is represented by only one of the three frequencies of interest at any one time. For example, where the three frequencies represent the three primaries of visible light, each of the optically encoded input signal components is, at any one time, blue, green or red. No mixing of the primary frequency components is contemplated in the preferred embodiment.

Thus, since each input signal component may be represented by any one of three states, i.e., each such component may take on one of three values, it is seen that the input signal components are, in fact, trinary level signals, or trinary digits. Moreover, where N input signal components form the input group, it is seen that the input signal group may represent any one of $3^N$ frequency encoded values. As shown in FIG. 1, the input group S(f) is provided to a logic function operator 10 which, in turn, provides an output signal group H(f).

Where the three frequency components of the various signal components are in the optical range, and the signals are in fact electromagnetic radiation (i.e., optical signals), the logic function operator 10 is an optical logic device performing logic operations on optical signals. As hereinabove described, the present invention provides logic processing of optical signals without the necessity of using optical logic operators.

This aspect of the invention is seen by referring again to FIG. 1, where it is seen that, in accordance with the invention, the logic function operator 10 is formed of a frequency sensing decoder 12 and a frequency selecting encoder 14. The decoder 12 receives the group S(f) of input optical signal components s(f) at its input and converts the same to a group S(v) of voltage logic levels representing the signal values. Preferably, decoder 12 decodes each of the trinary optical signal components s(f) into an ensemble $S_i(v)$ of a plurality of binary logic level signals $s_{ij}(v)$. The decoded binary signals may be processed by standard binary logic circuitry, shown as a binary logic circuit 16. The binary circuit 16, after operating on the decoded input signals $s_{ij}(v)$, generates a binary output ensemble $H_i(v)$ of individual binary output signals $h_{ij}(v)$ to represent each of the desired trinary output digits. The output ensemble generated by logic circuit 16 is some logic function of the input ensemble. The binary output signal components, $H_i(v)$, together, form a group H(v) representing in binary voltage levels the result of the binary logic operation on the input group S(v) of input signal components S(f).

The frequency selecting encoder 14, in turn, converts each of the binary voltage level output ensembles $H_i(v)$ to an optically encoded signal component h(f), provided in an output group H(f) representing the output of the logic function operator 10.

Thus, in its broad form, the present invention provides logic processing of optical signals by the use of standard binary logic level circuitry. More significantly, the circuit of FIG. 1 permits the use of standard, binary level, logic circuitry for processing trinary level optical signals.

Table I below illustrates operation of the invention in accordance with a preferred optical encoding scheme. As previously described, the input signal and its components are encoded to represent specific states, or logic levels, by specific frequencies. The entries of Table I represent the individual states of an input signal formed as a group of two input signal components (i.e., N=2) in terms of light primary colors, red (R), green (G) or blue (B). The numerical "value" associated with each logic state of the input group is obtained by assuming the colors of the encoded signals to represent numbers in a base 3 system. More specifically, the values found in Table I are obtained by assuming the input signal components to have values obtained by setting R=0, G=1, and B=2.

| $3^1$ | $3^0$ | VALUE |
|---|---|---|
| R | R | 0 |

-continued

| $3^1$ | $3^0$ | VALUE |
|---|---|---|
| R | G | 1 |
| R | B | 2 |
| G | R | 3 |
| G | G | 4 |
| G | B | 5 |
| B | R | 6 |
| B | G | 7 |
| B | B | 8 |

As is apparent from the foregoing table, the optically encoded signals indeed represent trinary logic information. Although the illustration uses but two signal components in the group, it will be appreciated that any number of signal components may be utilized to form an input signal group, as dictated by system requirements. Moreover, although the number of signal components forming a group may be chosen to be N, it is possible to use one or more of the components, or trinary digits, e.g., the most significant digit(s), as control characters or other identifiers. Thus, 4-digit signals may be used to represent any of 27 codes, such as the numbers 0-26, and the most significant digit may be used to indicate whether the following three digits represent: numbers and mathematical operators; alphabet and upper carriage characters; or special operators or commands.

Figure 2:
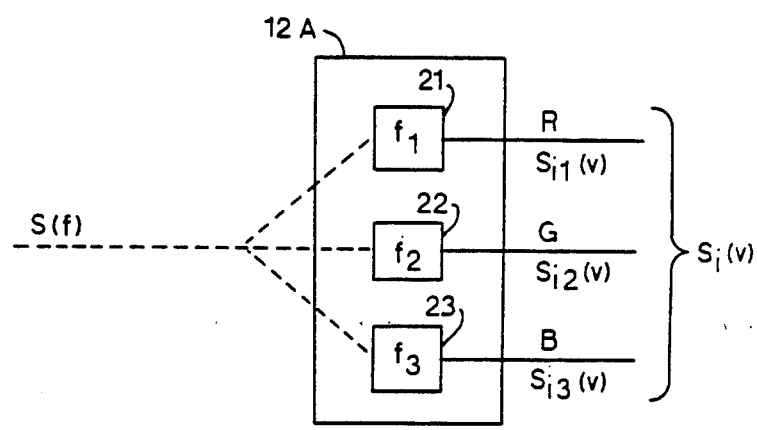
FIG. 2 shows a frequency sensing decoding structure for use in the invention structure of FIG. 1.

Referring now to FIG. 2, there is shown a frequency sensing, or decoding, apparatus in accordance with the invention. Therein, an optically encoded input signal component s(f), which represents one trinary digit of information as a single one of the primary colors, is incident on a frequency detecting apparatus 12a which provides three output signals $s_{ij}(v)$. As shown in the figure, frequency detecting apparatus 12a is comprised of three frequency detectors 21, 22 and 23. The three detectors respectively output three binary logic level signals, $s_{i1}(v) = R$, $s_{i2}(v) = G$, and $s_{i3}(v) = B$. The three output signals together form the ensemble of signals represented by $S_i(v)$ used to represent a single input trinary digit signal component. A plurality of decoders of the type shown in FIG. 2 are used to form the frequency sensing decoder 12 of FIG. 1, thus providing decoding for each of the N input signal components.

The frequency sensors 21, 22 and 23 shown in FIG. 2 may be formed as a bank of filters provided in the path of the incoming signal components, each filter having a photocell (or similar device) receiving its output and generating an output signal which is used to form one of the binary logic level signals $s_{ij}(v)$.

A beam splitter may be provided for each optically encoded input signal component to direct the same onto the bank of filters. However, any method or apparatus known in the art may be used to form the decoder shown in FIG. 2.

Figure 3:
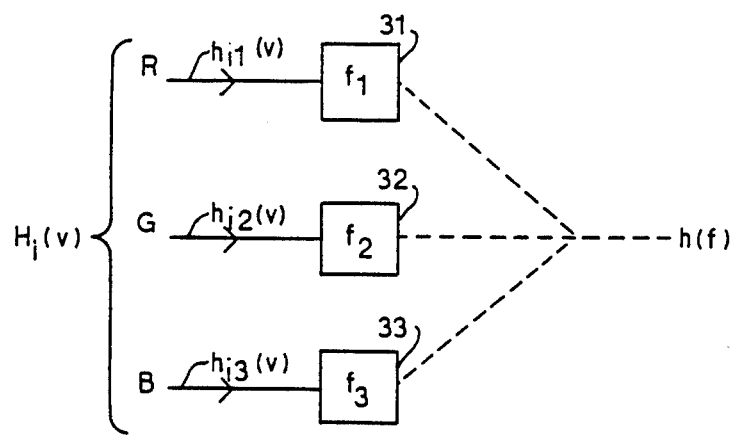
FIG. 3 shows a frequency selecting encoding structure for use in the inventive structure.

Referring now to FIG. 3, there is shown an encoder, or frequency selecting device, used to convert the binary output signals provided by the binary logic circuit 16 of FIG. 1 to optically encoded signals. As shown in the figure, the binary output ensemble $H_i(v)$ representing the $i^{th}$ output trinary digit is formed of a plurality of individual binary logic level signals $h_{ij}(v)$, representing the frequency values R, G, and B. A plurality of electro-optical color generating devices 31, 32 and 33, receive the binary logic signals and, responsive to an appropriate logic level thereof, generate the desired optical frequencies $f_1$, $f_2$, and $f_3$. The outputs of the three color generating devices are combined to form the optically encoded output digit h(f).

Figure 4:
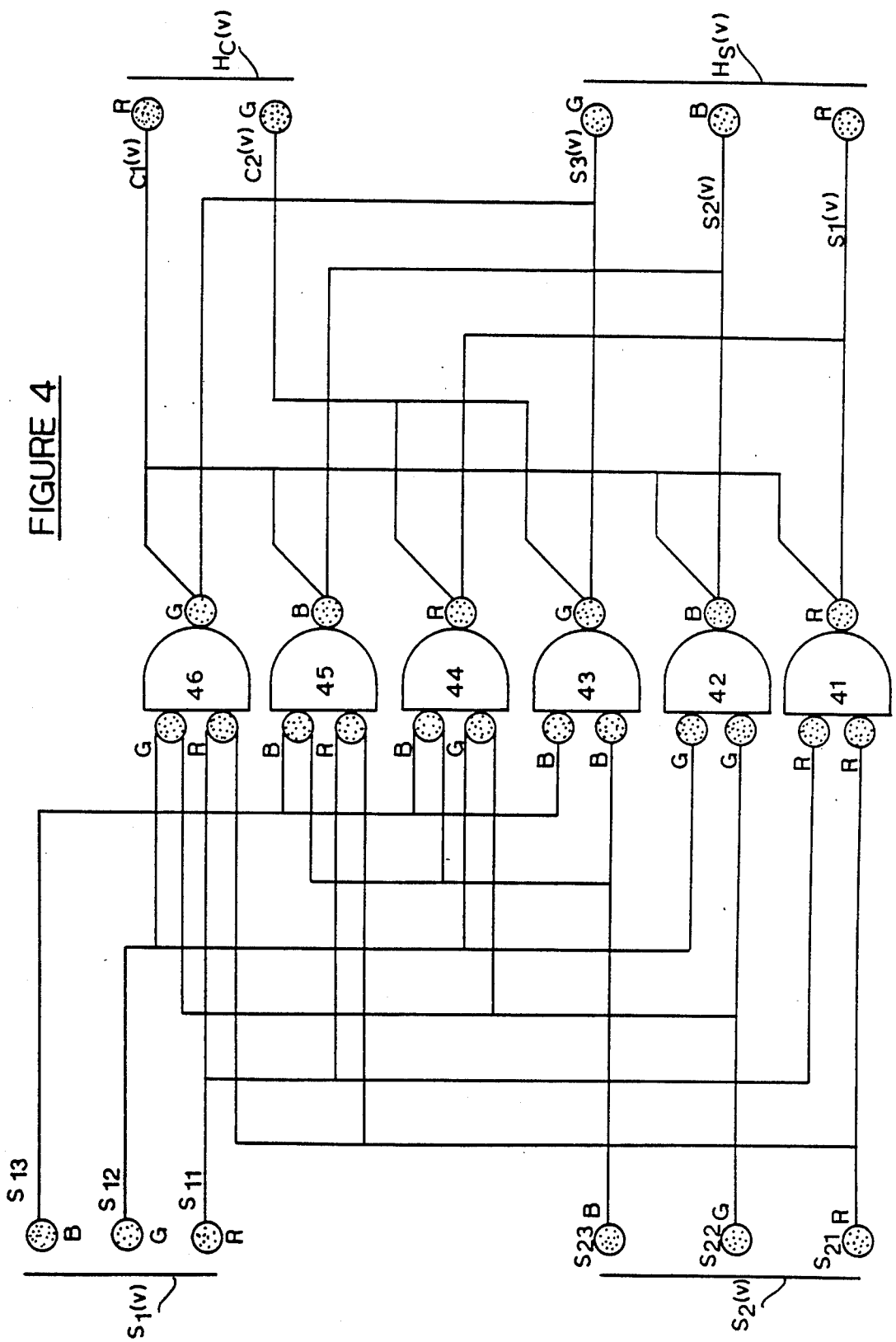
FIG. 4 provides a standard binary circuit forming a half adder for optically encoded trinary signals.

Referring now to FIG. 4, there is shown a binary logic circuit for performing a logic operation on the decoded form of frequency encoded input signals. Specifically, there is provided in the structure of FIG. 4 a half adder for use in providing trinary sum and carry digits representing an addition of any two decoded trinary level signals.

Using the terminology and reference numerals developed with reference to FIGS. 1, 2 and 3, there are shown two input trinary digits $S_1(v)$ and $S_2(v)$, each having three binary logic level signals representing R=0, G=1 and B=2. The individual components are shown on the drawing as $s_{11}(v)$, $s_{12}(v)$, ... $s_{23}(v)$. Six AND gates are used to perform the binary operations which result in output binary level signals representing the sum and carry for an addition of the two input digits $S_1(v)$ and $S_2(v)$. The output signals are represented as $h_{s1}(v)$, $h_{s2}(v)$ and $h_{s3}(v)$, forming the output sum digit $H_s(v)$ and $h_{c1}(v)$, and $h_{c2}(v)$, forming the output carry digit $H_c(v)$.

As is seen from the figure, the six AND gates 41–46 of the half adder include inputs which form all possible pair combinations of the input binary logic components of the decoded trinary digits. For each possible pair combination to be added, one and only one of the AND gates will have a "high" level binary output, while all the others will provide a "low" level binary output. Since for each pair of input combinations there is one and only one proper set of output sum and carry signals, the outputs of the various AND gates are used to provide the set of sum and carry signals. Towards that end, the outputs of the various gates are assigned specific trinary level representations, viz., B, G or R. This assignment is made in accordance with the desired function being performed by the logic operator. Thus, when both input signals $S_1$ and $S_2$ are zero (R), i. e., $s_{11} = s_{21} =$ "high", all others= "low", the result is zero sum and zero carry. Thus, the output of that AND gate receiving $s_{11}$ and $s_{21}$ as its inputs is assigned to the $h_{s1}$ and $h_{c1}$ output signals. As is seen from FIG. 4, AND gate 41 provides its output precisely to these signals, which are used to form the R components of the output sum and carry signals.

Similarly, it is known that for $S_1=2$ and $S_2=1$ the sum is 3, which is represented by a sum of 0 and a carry of 1. Accordingly, AND gate 44, which receives as its inputs the $s_{13}$ and $s_{22}$ inputs and is the only gate having both inputs at a high level, provides its output to the $h_{s1}$ and $h_{c2}$ output signals. It should be noted that the present use of six AND gates provides the minimal number of gates capable of providing the necessary outputs for each and every possible combination of input values. Thus, gate 44 is connected to receive at its inputs both the $s_{13}$-$s_{22}$ and the $s_{23}$-$s_{12}$ input bit combinations so that when either $S_1=2$, $S_2=1$ or $S_2=2$, $S_1=1$ there will be provided a high level output on $h_{s1}$ and $h_{c2}$. Similar arrangements are provided for each of the gates in the half adder circuit.

It is appreciated, of course, that each gate may be connected to receive but a single combination of input values, rather than receiving all combinations of input values resulting in the same outputs. Accordingly, the half adder of FIG. 4 may be modified by providing a pair of AND gates 44a and 44b for providing outputs representing the situations wherein $S_1=2$, $S_2=2$, $S_1=1$, respectively, without departing from the spirit of the invention. In the event that the described modification is used, the outputs of the two AND gates 44a and 44b are input to an OR gate, or are wire-OR'ed, to provide the binary signals to $h_{s1}$ and $h_{c2}$.

As is also seen in the figure, each of the output binary level signals may receive the outputs of more than one gate. For example, a sum digit of "one" (i.e., $H_s=G$, or $h_{s3}=1$) is generated whenever input signals corresponding to 2,2; 1,0; or 0,1 are present at the $S_1$, $S_2$ inputs, respectively. Since both input sets of $S_1=1$, $S_2=0$ and $S_2=1$, $S_1=0$ are input to AND gate 46, it is seen that the outputs of gates 46 and 43 are OR'ed to provide the output $h_{s3}$ binary signal. In the preferred embodiment of FIG. 4, the outputs of gates 43 and 46 are wire OR'ed. Clearly, OR gates may be used for this purpose.

The structure shown in FIG. 4 is connected to provide output signals according to Table II, wherein the output values are written in base 3 notation. For any output capable of representation by a single nonzero trinary digit, the generated carry digit is zero. For the three cases in which the outputs are represented by two nonzero digits, a carry digit is generated.

TABLE II

| $S_1$ | $S_2$ | Sum | $H_c$ | $H_s$ |
|---|---|---|---|---|
| 0 | 0 | 00 | R | R |
| 0 | 1 | 01 | R | G |
| 1 | 0 | 01 | R | G |
| 0 | 2 | 02 | R | B |
| 2 | 0 | 02 | R | B |
| 1 | 1 | 02 | R | B |
| 1 | 2 | 10 | G | R |
| 2 | 1 | 10 | G | R |
| 2 | 2 | 11 | G | G |

Figure 5:
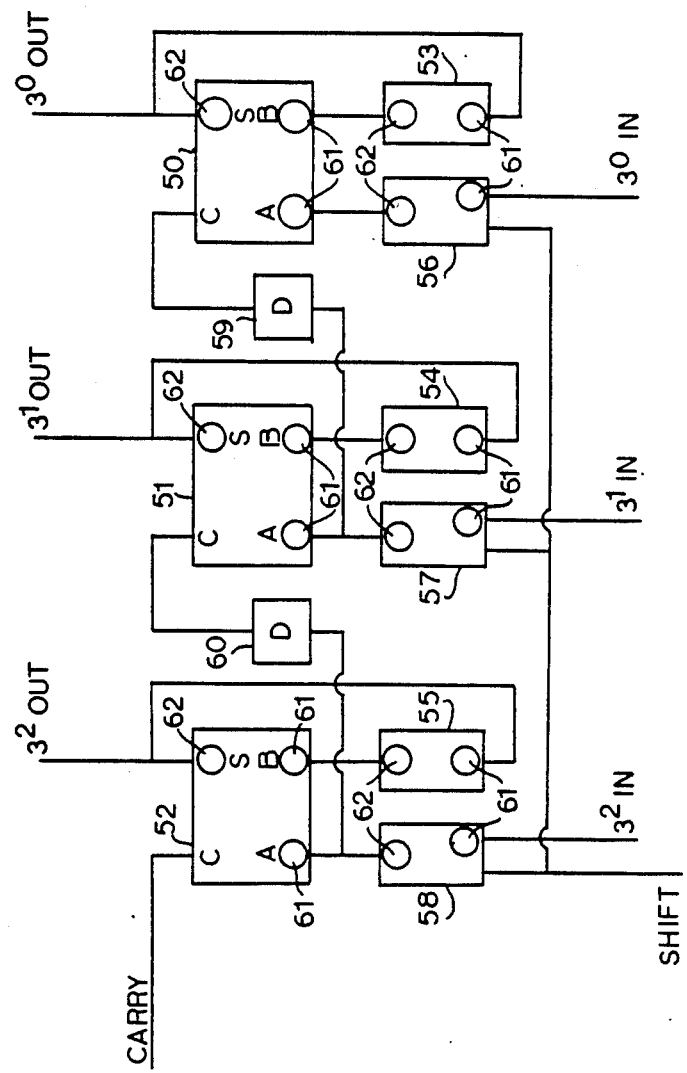
FIGS. 5 and 6 show full parallel and serial adders for optically encoded trinary signals.
Figure 6:
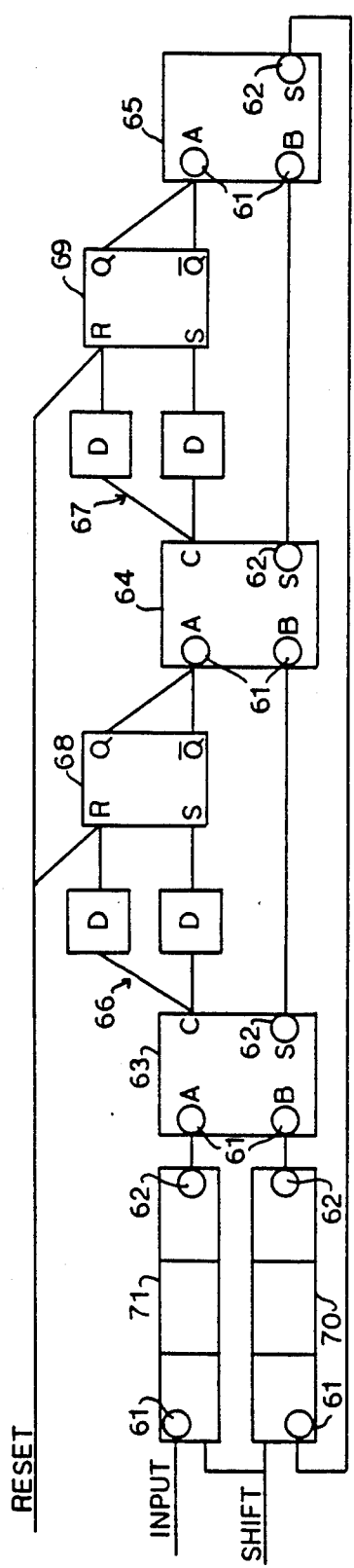

A single half adder as shown in FIG. 4 may be used for serial addition of input signal groups of N trinary digits, as described infra with respect to FIG. 6. Alternatively, a plurality of such half adder stages may be connected to provide a parallel adder as shown in FIG. 5. Referring initially to the parallel adder of FIG. 5, N half-adder stages are provided therein. Illustratively, where groups of three trinary digits are to be added, three half adder stages are provided, as shown at 50, 51 and 52, respectively, in the figure. One stage is provided for each significant digit to be added, beginning with the least significant digit ($3^0$) on the right and progressing to the most significant digit ($3^N$) on the left. In the present illustrative example, where N=3, stage 50 provides the least significant output digit, $3^0$; stage 51 provides the next significant output digit $3^1$; finally, state 52 provides the most significant output digit, $3^2$.

Figure 7:
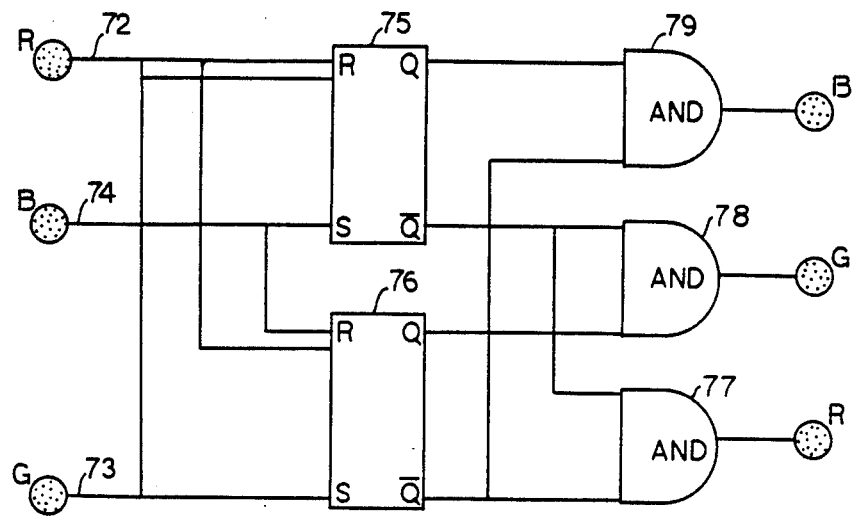
FIG. 7 shows a latching register for optically encoded trinary logic signals.
Figure 8:
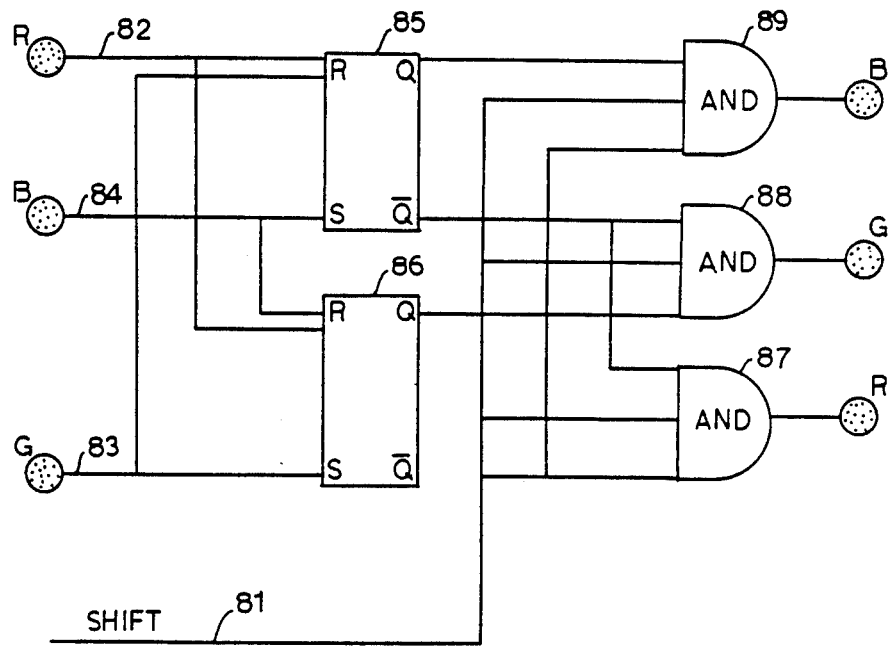
FIG. 8 shows a shift register for optically encoded trinary signals, useful in the circuit of FIGS. 5 and 6.

Although three half-adder stages are provided, each stage of the adder includes additional circuitry. More specifically, each stage of the adder is comprised of a half-adder stage, together with an accumulator register (shown at 53, 54 and 55) and an incident register (shown at 56, 57 and 58). A structure in accordance with the present invention for forming the accumulator and incident registers is shown in FIGS. 7 and 8. Before discussing those structures, however, it will suffice to indicate that the accumulator registers each provide to an appropriate half adder stage, at an input B thereof, an output equal to the sum of the sequence of digits input thereto since a preceding clear pulse. The incident registers each shift an input digit thereof to the appropriate half adder stage, at an input A thereof, in accordance with occurrence of a clock signal.

In operation, the registers in the adder of FIG. 5 are cleared to have an output state representing a trinary zero, whether as a binary representation of an ensemble of signals or as a single optically encoded signal. The N digits of the first number to be added are read into the incident registers and shifted to the half adders at an appropriate time. In each stage, the shifted digit is added by the half adder to the output of the associated accumulator register. Thus, half adder stage 51 adds the its input A, obtained from incident register 57, to its input B, obtained from accumulator register 54. The sum digit generated by the half adder stage is fed back from the S output of the half adder to the input of the accumulator register 54. The sum is used to toggle the register and to replace the previously stored digit therein.

As is seen from the figure, the carry digit generated in each stage is fed ahead to the A input of the next succeeding stage, after a delay D, shown at 59 and 60. The delays are provided to assure that, prior to taking the carries into account, the addition of the incident digits has concluded and that the resulting sum has been entered in the accumulator. Thus, after clearing the incident and accumulator registers, the first input digits, representing the first operand, are provided to the incident registers 56-58. After clocking the incident digits to the A inputs of the half adders, these digits are added to the B input digits, which, at this stage, are zero. Thus, no carries are generated after the initial addition cycle.

Upon providing the second set of input digits to the incident registers, representing the second operand, these digits are clocked to the A inputs of stages 50-52 for addition to the B inputs thereof. The B inputs, however, are provided from the outputs of the accumulator registers 53-55 which, it will be recalled, store the first operand at this time. Thus, the outputs of the half adder stages 50-52, after an appropriate settling time, will represent the sum digits generated by addition of the two operands. The sum digits are, in turn, provided to the inputs of accumulator registers 53-55, to replace the previously existing digits therein.

After a delay D, chosen to be sufficiently long as to allow both for settling of the half adder stages and for settling of the resulting sum digits in the accumulator registers, the carry digits are provided to the A inputs of the two half adder stages 51 and 52, for a final addition to be performed therein. During this third pass through the half adders, the carry digits are added to the previously computed sum digits, thereby to generate the correct, full sum of the two input operands.

Thus, the structures of FIGS. 4 and 5 utilize binary logic devices to perform trinary logic operations on optically encoded trinary signals, thereby simulating optical trinary logic devices. In each circuit, the input and output signals may be the optically encoded signals, in which case the appropriate frequency sensing and frequency selecting devices are provided for these circuits in the manner shown in FIGS. 1-3 of the drawing. Alternatively, the circuits of FIGS. 4 and 5 may operate on binary logic level signals, representing decoded versions of the input optical signals. In either case, the circuits provide binary circuits to perform trinary logic functions for optically encoded signals. Additionally, it should be recognized that where optically encoded signals are provided as the inputs to the parallel adder of FIG. 5, each component device thereof, including the registers and the half adder stages, may include optical decoders and encoders, so that the devices may communicate using optically encoded signals, rather than the binary level voltage representations of the same. This mode of operation is, in fact, preferred and illustrated in FIG. 5 by providing frequency sensing and selecting encoders and decoders 61 and 62, respectively.

Referring now to the serial adder of FIG. 6, there is provided a structure for adding a sequence of input signals each representing, in optically encoded serial form, a set of N trinary digits, where N is any predetermined number. As was described for the parallel adder of FIG. 5, the structure of FIG. 6 provides binary circuits for performing trinary logic operations on optically encoded signals. Thus, as with the parallel adder, an optical trinary logic device is simulated by standard binary circuits. Similarly to the circuit of FIG. 5, wherein the illustrative parallel adder structure provides optical communication among the various devices, frequency sensing decoders and frequency selecting encoders are represented, respectively, by the circles labelled 61 and 62 in the serial adder of FIG. 6.

In the serial adder, there are provided three half-adder stages, 63, 64 and 65. However, unlike the circuit of FIG. 5, the number of half adder stages is fixed, regardless of the number of digits in the number sequences being added. In addition to the three half-adder stages, there are provided two sets of delays 66 and 67 and a pair of flip flops 68, 69 for the carry outputs of stages 63, 64, respectively. These flip flops are optional and are used to provide better time definition for arrival at the inputs of one stage the carry signals generated by the preceding stage. The serial adder further includes an accumulator register 70 and an incident register 71.

Addition is performed on the circuit of FIG. 6 by entering each trinary number serially, beginning with the least significant digit and concluding with the most significant digit. Although the number of half-adder stages in the serial adder is fixed, the number of register stages for the accumulator and incident registers may be changed to correspond to the number of digits, N, in the signals to be added.

Operation of the adder requires all registers and flip flops to be cleared to an initial output state of trinary zero. The first number to be added is read into the incident register 71 and shifted through the adder into the accumulator register 70. The resulting number stored in the accumulator is unchanged from this first input number, since each of the registers had previously been reset. The second number to be added is then provided to the incident register 71. Thereafter, with the two operands aligned in their respective registers, the least significant digits of each are shifted, simultaneously, to the adder.

The first adder stage, 63, adds the two digits and provides the sum output thereof to the second stage 64. In stage 64 the sum digit output by stage 63 is added to the carry output resulting from addition of the previous digit. When adding the least significant digits, which are the first digits provided to othe adder, however, flip flop 68 had been reset to zero, so that the second stage adds zero to the sum output of the first stage. To the resulting sum is added a signal representing a possible carry resulting from the addition of the carry to the first sum of a previous digit. This "secondary" carry addition is performed at the third stage 65. However, with flip flop 69 having also been cleared to zero, for addition of the least significant digits the output of the third stage will provide the unchanged sum output of stage 63 to the accumulator input.

After addition of a number of digits, various carries will be generated. In trinary addition, a carry of zero or one will be generated at each stage. The carry outputs, which are not optically encoded but which are treated as binary logic signals, are delayed by the interstage delays 66 and 67 so as to allow the sum of digits in the $k^{th}$ position to be added to the carry generated as a result of the addition of the $k-1^{th}$ position. Similarly, since addition of a carry to the sum of the $k^{th}$ position may result in generation of a secondary carry by stage 64, this carry is also delayed to assure its addition to the sum of the $k+1^{st}$ position in stage 65.

Because the additions are in a base 3 system, the carry into any position is always zero or one. Further, since the largest possible sum of two trinary digits, 2, can only be generated if no carry is generated, and if a carry is generated by addition of two digits the largest possible sum of those two digits is 1, it is seen that addition of a secondary carry to a sum digit can not result in generation of a further carry. Thus, the carry output of stage 65 will always be zero. Accordingly, the carry output of this stage is not further processed in the adder of FIG. 6.

The digits of the two trinary numbers are thus added sequentially, with the resulting carry corrected sum digits being recirculated for storage in accumulator register 70. To complete the serial addition, a pair of zeros are shifted from the registers 70, 71 to the first adder stage 63 immediately after entry of the most significant pair of digits thereto. As the zeros proceed through the three adder stages, all remaining carry signals are added thereto, the sum of the remaining carries being entered into the accumulator register in the most significant digit position. If another number is to be added, the signals representing this number are read into the incident register 71, and the addition sequence is repeated as described above. Unlike the previous description, however, the flip flops and registers are not cleared prior to addition of any number subsequent to the first number of a sequence. Thus, each digit is added to a corresponding digit of the previously accumulated sum in register 70.

Referring now to FIGS. 7 and 8, there are provided two binary logic circuits for performing the trinary latching operations of the flip flops of FIG. 6, as well as the shift register function required by the accumulator and incident registers of FIGS. 5 and 6.

The register of FIG. 7 functions as a latch for an input trinary signal. More specifically, an input trinary signal representing one of the values 0, 1 or 2 by a pulse signal on one and only one of the R, G or B lines 72, 73 or 74, respectively, is latched into, and output by, the register of FIG. 7. The output of the latch will maintain the output signal at the latched input value until either being reset or being changed by a subsequent input pulse. The latch may be made responsive to a clock pulse, as is known in the art, thereby providing a delay function between occurrence of the input value and the provision of the appropriate output.

With reference to the specific structure of FIG. 7, there are provided a pair of binary Set-Reset flip flops 75, 76 which receive the input signal pulses as shown. Thus, the R input on line 72 is provided to the R terminals of both flip flops 75 and 76, so that for an input of zero, i.e., a pulse on the R line 72, both flip flops are reset. Similarly, input pulses on the G line 73 are connected to the R, S inputs of the flip flops 75, 76 while input pulses on the B line 74 are coupled to the S, R inputs of the respective flip flops. Although the R inputs to the two flip flops are each shown symbolically as receiving two inputs, it should be understood that the respective inputs may receive wire OR'ed or gated inputs to provide the necessary resetting function.

The two flip flops may be thought of as providing a two-bit encoding of the possible values represented by the R, G and B signals, corresponding to the trinary values 0,1 and 2. Accordingly, a binary simple decoder, comprised of three AND gates 77, 78 and 79, is used to convert the two-bit representation of the input signal to a continuing high level on one and only one output line.

For example, where the input signal represents 2, i.e., a pulse is provided on the input B line 74, flip flop 75 is set thereby while flip flop 76 is reset. Thus the Q outputs of the two flip flops are, respectively, 1,0. Similarly, in response to a pulse input on line 72, representing 0, the Q outputs of the two flip flops are 0,0. Finally, for a pulse input on the G line, representing 1, the Q outputs of the flip flops are 0,1. By connecting the inputs of the AND gates to the appropriate positive and inverted outputs of the flip flops, the above mentioned 0,0 output state causes AND gate 77 to provide a high level output. Thus, the output of gate 77 is labelled R and, where necessary, used to trigger a frequency selecting circuit to encode an R output. Similarly, AND gate 78 is connected so that a 0,1 output condition of the flip flops, representing a G input to the latch, provides a high output from the gate. Accordingly, the output of gate 78 is labelled G. Finally, gate 79 is connected to be activated by a 1,0 output state of the flip flops, and is accordingly labelled B. It is noted, however, that the internal encoding of the R, G and B signals as 0,0; 0,1; and 1,0 is not at all necessary for the functioning of the latch. That is, line 72 (and the output of gate 77) may both be relabelled G, or B, together with appropriate relabelling of lines 73–74 and the outputs of gates 78–79. All that is required is that for a pulse on one and only one of the input lines there will be provided a continuous high level on one and only one of the output lines. The register shown in FIG. 7 thus simulates an optical trinary latch with the use of standard binary circuits and stores one trinary digit of information therein. A plurality of such stages may be connected in parallel to provide a register for storing a group of trinary signals in a parallel fashion.

Referring now to the circuit shown in FIG. 8, there is provided a single stage of a shift register. It is noted that each of the connections and components provided in the latch of FIG. 7 is also provided in the shift register of FIG. 8. Accordingly, no further elaboration is required, other than to note that reference numerals 82, 83, . . . 89 in FIG. 8 correspond to reference numerals 72, 73, . . . 79 in FIG. 7. However, the shift register stage further includes a shift input on line 81. It is thus seen that, unlike the latch of FIG. 7, which provides a latched output on occurrence of an input pulse, the shift register stage of FIG. 8 will not provide an output from AND gates 87–89 until application of the shift signal on line 81. This signal is used to enable each of the AND gates, and only in conjunction therewith can an output signal be provided. Where a sequence of such stages are cascaded, the provision of a shift pulse will result in transfer of the outputs of the flip flops of one stage via the pulse enabled AND gates to the flip flops of the next stage. The flip flops of the next stage will then assume the new output voltage levels, but will not communicate the same to the succeeding stages until application of the next shift pulse.

The output of a shift register stage is thus dependent on the shift signal, and may be continuous or pulsed, depending on the shift signal. The input pulse signal is stored until the register is reset, toggled by a new input, or shifted. In operation, the register is first cleared by a pulse to the reset inputs of all the flip flops in all the register stages. A trinary number may be read into the shift register with all the digits entered in parallel or serially. For a parallel input of the trinary digits, the clearing step may be omitted from operation of the register.

When a trinary number is serially read into the shift register, the least significant digit ($3^0$) is first entered. A shift pulse, slightly preceding the second least significant digit ($3^1$) to be entered, causes the least significant digit to be shifted to the next stage. A shift pulse slightly preceeding the $k^{th}$ digit causes all preceding digits to be shifted to their next respective stages.

Accordingly, trinary numbers may be latched or shifted, as necessary, with the aid of the circuits of FIGS. 7 and 8. These circuits may thus form the delays as well as the incident and accumulator registers used in the trinary adders of FIGS. 5 and 6.

There has thus been disclosed standard binary circuitry for performing logic operations on optically encoded trinary logic signals. The disclosed circuitry operates without requiring complex optical trinary devices. Although preferred embodiments of the invention were disclosed, it is recognized that a number of variations are possible in the physical structure embodying the invention. For example, although optically encoded signals have been described, it is equally possible to use signals at any frequency range in carrying out the invention. Thus, any electromagnetically radiated signals of any number of frequencies may be used to encode digits in a particular number base system. The signals may be transmitted in any manner, and may be decoded to binary signals for operation by binary logic operators. Thereafter, the resulting binary signals may again be encoded to the frequencies of inerest.

It is appreciated that many such modifications will occur to those of ordinary skill in the art. All such modifications are included within the scope of the invention, which is defined by the appended claims when interpreted in accordance with the full breadth to which they are legally and equitably entitled.

I claim:

1. In a logic apparatus for performing logic operations on frequency encoded signals, the improvement comprising:
   means for decoding and encoding optical input and output signals to and from said apparatus, said signals having three frequency components, said means including
   frequency sensing decoding means for sensing the presence or absence of said three frequency components in said input signals and converting said frequency signals to specific electrical binary signals having logic levels indicative of presence or absence of said frequencies;
   a binary logic circuit adapted to accept said electrical binary signals from the decoding means, to perform logic operations on said signals, and to provide an output ensemble of electrical binary signals; and
   frequency selecting encoding means for converting said ensemble of electrical binary signals to output optical signals having said three frequency components whereby there is encoded logic levels of specified ones of said individual binary signals as presence or absence of said frequency components.

2. Apparatus as recited in claim 1 wherein said binary logic circuit comprises adder means, and
   wherein said binary signals produced by said frequency sensing decoding means comprise trinary logic signals representing an augend and an addend, and
   wherein said output optical signal produced by said frequency selecting encoding means comprises a sum output signal and a carry output signal.

3. An apparatus as recited in claim 2 wherein said adder means comprises at least six binary AND gate circuits, each receiving at least one binary level signal forming a trinary logic signal representing each of said augend and addend.

4. A logic apparatus for performing logic operations on an input optically encoded signal and producing at least one output signal comprising:
   optical frequency sensing means for converting presence or absence of predetermined optical frequencies in said input signal to binary encoded signals having binary signal levels,
   binary logic means for receiving said binary encoded signals and performing logic operations on said signals, said binary logic means including means for providing an ensemble of output binary signals, and
   frequency selecting means for converting said ensemble of output binary signals to presence or absence of said optical frequencies in an output optically encoded signal representing the logic operations performed on said input optically encoded signal.

5. Apparatus as recited in claim 4 wherein said optical frequency sensing means is operable for detecting and converting presence or absence of three optical frequencies to said binary level signals and said frequency selecting means is operable for converting said output binary signals to presence or absence of said three optical frequencies in said output optically encoded signal.

6. Apparatus as recited in claim 5 wherein said binary logic means includes shift register means receiving said input binary encoded signal and producing an output binary encoded signal representative thereof,
   said shift register means comprising a pair of binary Set-Reset flip flops each of said pair adapted to receive three input binary level signals and
   output AND gate means for combining output signals from said pair of flip flops to provide said ensemble of output binary signals to said frequency selecting means.

7. Apparatus as recited in claim 5 wherein said binary logic means comprises logic half adder means receiving two input binary encoded signals representing two operands and producing an output binary encoded signal representing a sum signal.

8. Apparatus as recited in claim 7 wherein said logic half adder means comprises a plurality of AND gates each receiving two signals, one from each of said input binary encoded signals representing said two operands.

9. Apparatus as recited in claim 7 wherein said binary logic means comprises accumulator register means and incident register means connected to said half adder means, said incident register means connected for receiving a sequence of input binary encoded signals representing trinary digits for cumulative addition, said accumulator register means connected to at least one half adder means for receiving signals representing trinary digits of a sum determined thereby, said accumulator register means storing said sum and providing said sum for addition with subsequently input trinary digits from said incident register means.

10. Apparatus as recited in claim 5 wherein said binary logic means comprises logic register means receiving said input optically encoded signal and producing a latched output optically encoded signal responsive thereto.

11. Apparatus as recited in claim 10 wherein said logic register means comprises
    a pair of binary Set-Reset flip flops each of said pair adapted to receive three binary level signals representing presence or absence of said three optical frequencies and
    output AND gate means of combining output signals from said pair of flip flops to provide said ensemble of output binary signals to said frequency selecting means.

12. Apparatus as recited in claim 4 wherein said binary logic means includes shift register means receiving said binary encoded signal and producing an output binary encoded signal representative thereof.

13. Apparatus as recited in claim 12 wherein said logic shift register means comprises means responsive to a shift signal applied thereto.

14. Apparatus as recited in claim 12 wherein said binary logic means comprises parallel adder means for receiving substantially simultaneously from said optical frequency sensing means a group of input signals representing trinary digits, and for outputting a plurality of trinary digits representing an accumulated sum of said input digits with previously input trinary digits from said shift register means.

15. Apparatus as recited in claim 14 wherein said parallel adder comprises a plurality of stages each including
    a half adder, an accumulator register and an incident register arranged such that said accumulator register provides an output to said half adder equal to the sum of digits input thereto during a time period following a clear pulse, that said incident register shifts a digit to said half adder upon occurrence of a clock signal, and that a sum digit generated by said half adder is fed back to said accumulator register.

* * * * *